United States Patent
Hsiao et al.

(10) Patent No.: US 9,691,911 B1
(45) Date of Patent: Jun. 27, 2017

(54) SEMICONDUCTOR DEVICE

(71) Applicant: UNITED MICROELECTRONICS CORP., Hsin-Chu (TW)

(72) Inventors: Shih-Yin Hsiao, Chiayi County (TW); Ching-Chung Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/995,174

(22) Filed: Jan. 13, 2016

(30) Foreign Application Priority Data

Dec. 21, 2015  (CN) .......................... 2015 1 0961986

(51) Int. Cl.
| | | |
|---|---|---|
| H01L 27/06 | (2006.01) | |
| H01L 29/872 | (2006.01) | |
| H01L 29/06 | (2006.01) | |

(52) U.S. Cl.
CPC ...... *H01L 29/8725* (2013.01); *H01L 29/0623* (2013.01)

(58) Field of Classification Search
CPC ..................... H01L 29/8725; H01L 29/0623
USPC ........................................ 257/484, 384, 474
See application file for complete search history.

(56) References Cited

U.S. PATENT DOCUMENTS

| | | | |
|---|---|---|---|
| 8,125,051 B2 | 2/2012 | Chuang et al. | |
| 2008/0135970 A1* | 6/2008 | Kim ...................... | H01L 29/872 257/471 |
| 2009/0020826 A1* | 1/2009 | Huang .................. | H01L 29/782 257/371 |
| 2009/0283841 A1* | 11/2009 | Yeh ...................... | H01L 27/0814 257/384 |
| 2012/0068297 A1* | 3/2012 | Tsai ..................... | H01L 27/0629 257/474 |
| 2012/0187520 A1* | 7/2012 | Kato ................... | H01L 27/0629 257/475 |

\* cited by examiner

*Primary Examiner* — Cuong Q Nguyen
*Assistant Examiner* — Tong-Ho Kim
(74) *Attorney, Agent, or Firm* — Winston Hsu

(57) ABSTRACT

A semiconductor device include a substrate, a first well region formed in the substrate, a first isolation structure formed in the first well region, a Schottky barrier structure formed on the first well region, and a plurality of assist structures formed on the first well region. The substrate includes a first conductivity type, the first well region includes a second conductivity type, and the first conductivity type and the second conductivity type are complementary to each other. The assist structures physically contact the first well region.

20 Claims, 10 Drawing Sheets

US 9,691,911 B1

SEMICONDUCTOR DEVICE

BACKGROUND OF THE INVENTION

1. Field of the Invention

This invention relates to a semiconductor device, and more particularly, to a semiconductor device integrated with a Schottky diode.

2. Description of the Prior Art

A Schottky diode is a unipolar device using electrons as carriers. Since the carrier recombination is nearly eliminated, the switching speed of the Schottky diode is high. Moreover, in response to a low forward bias voltage ($V_f$), the Schottky diode has higher forward current and shorter reverse recovery time ($t_{RR}$). And high-frequency signals produced by the Schottky diode can be turned-off quicker than conventional PN junction devices.

Please refer to FIGS. 1 and 2, which are schematic drawings illustrating a conventional semiconductor device integrated with Schottky diode at intermediate stages of fabrication. As shown in FIG. 1, the conventional semiconductor device integrated with Schottky diode 100 includes a substrate 102, a large opening area of n-well 104, a ring-shaped insulating layer 106, a metal silicide layer 108, a ring-shaped isolation structure 110, and an n-doped region 112 serving as the drain. As shown in FIGS. 1 and 2, the ring-shaped insulating layer 106 can be, for example a self-aligned silicide blocking (hereafter abbreviated as SAB) layer formed on the n-well 104 for defining regions where the metal silicide layer 108 to be formed, and the metal silicide layer 108 and the n-well 104 construct a Schottky diode.

It should be noted that other devices for constructing the integrated circuits (ICs) can be disposed on the substrate 102. For example, transistor devices are formed on the substrate 102. And an inter-layer dielectric (hereinafter abbreviated as ILD) layer 130 is formed on the substrate 102 after the devices required to be formed on the substrate 102 are fabricated. Thereafter, a planarization process is performed to remove superfluous dielectric layer to obtain a flat surface. However, as shown in FIG. 1, since Schottky diode is formed on the large opening area of n-well 104, device density of this given area is much lower than device densities of other area. Consequently, over-polishing issue, also known as dishing effect, is often found during the planarization process. And thus a recess 140 is formed on in the ILD layer 130 on the Schottky diode.

Furthermore, a replacement metal gate (hereinafter abbreviated as RMG) process may be performed after forming the ILD layer 130 if required. Accordingly, the planarization process is to further polish other layer(s) formed on the substrate 102, such as the contact etch stop layer (CESL) 124 and the hard mask layer/cap layer 122 which is used to protect the dummy gate 120. During this planarization process, the dishing effect is worsened: the metal silicide layer 108 may be damaged by this planarization process. It is well-known to those skilled in the art that, according to the RMG process, the dummy gate 120 is removed to form a gate trench (not shown), and followed by filling the gate trench with work function metal layer(s) and filling metal(s). Then, another planarization process is performed to remove superfluous metal material and thus a metal gate 150 is obtained. However, the metal material 152 is to be unavoidably remained in the recess 140 after the planarization process as shown in FIG. 2. And the metal material 152 remained in the recess 140 seriously causes adverse impacts to the following interconnection fabrication processes.

It is therefore concluded that the semiconductor device integrated with Schottky diode faces difficulties in the fabrication processes, it even renders adverse impacts to IC reliability. Consequently, a semiconductor with Schottky diode which is able to avoid the abovementioned dishing effect is still in need.

SUMMARY OF THE INVENTION

According to an embodiment of the present invention, a semiconductor device is provided. The semiconductor device includes a substrate, a first well region formed in the substrate, a first isolation structure formed in the first well region, a Schottky barrier structure formed in the first well region, and a plurality of assist structures formed on the first well region. The substrate includes a first conductivity type, the first well region includes a second conductivity type, and the first conductivity type and the second conductivity type are complementary to each other. The assist structures physically contact the first well region.

According to another embodiment of the present invention, a semiconductor device is provided. The semiconductor device includes a substrate, a first well region formed in the substrate, a first isolation structure formed in the first well region, a Schottky barrier structure formed in the first well region, a plurality of assist structures formed on the first well region, and a plurality of first contact plugs formed in the first well region. The substrate includes a first conductivity type, the first well region includes a second conductivity type, and the first conductivity type and the second conductivity type are complementary to each other. The assist structures physically contact the first well region, and the first contact plugs are electrically connected to the assist structures.

According to the semiconductor devices provided by the present invention, the plurality of assist structures electrically floating or electrically connected to the contact plugs are formed in the first well region, therefore the device density at where the Schottky diode is formed is increased, and thus dishing effect is efficaciously avoided during the planarization process.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention maybe practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

Figure 1:
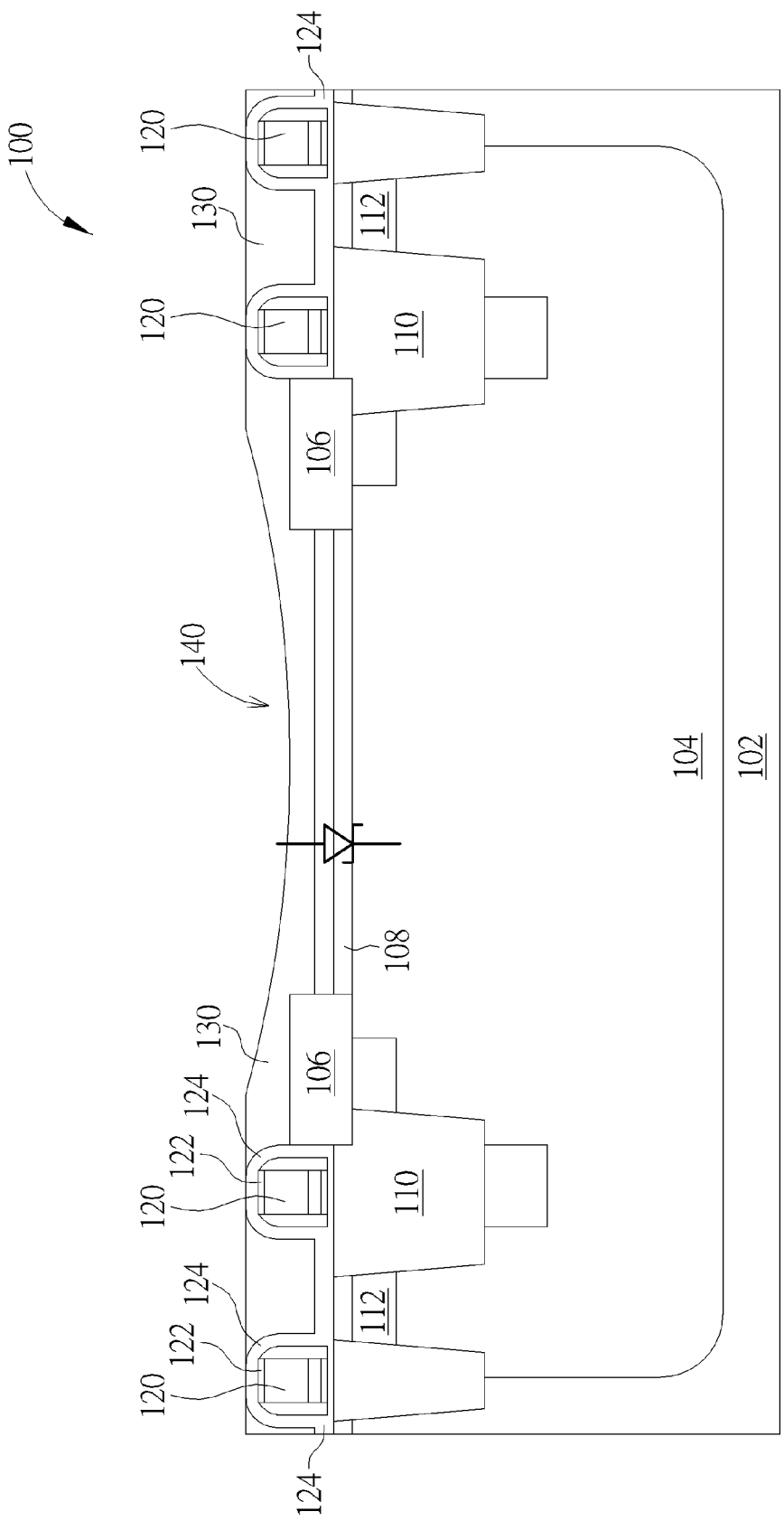
FIGS. 1 and 2 are schematic drawings illustrating a conventional semiconductor device integrated with a Schottky diode at intermediate stages of fabrication.
Figure 2:
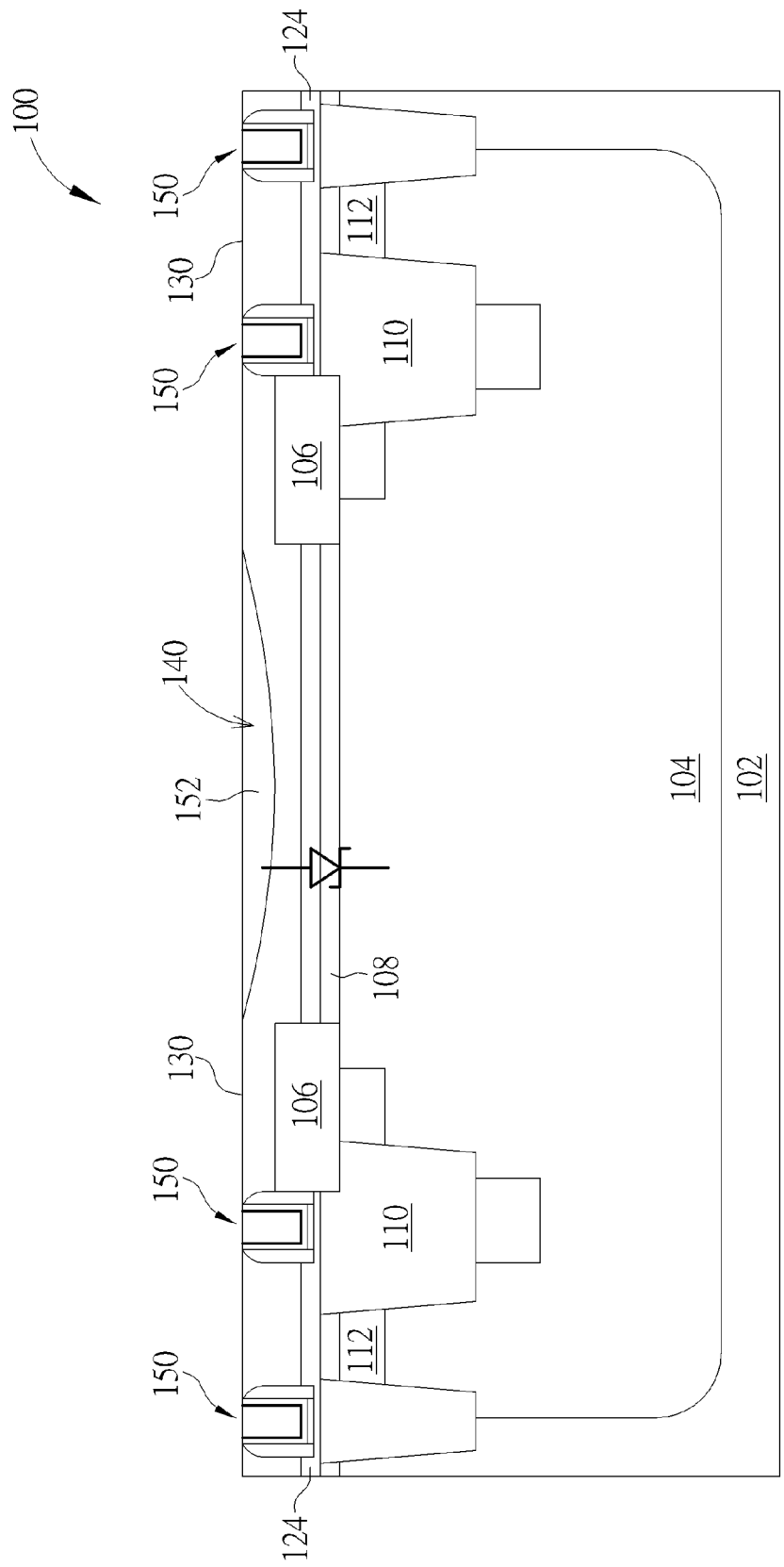
Figure 3:
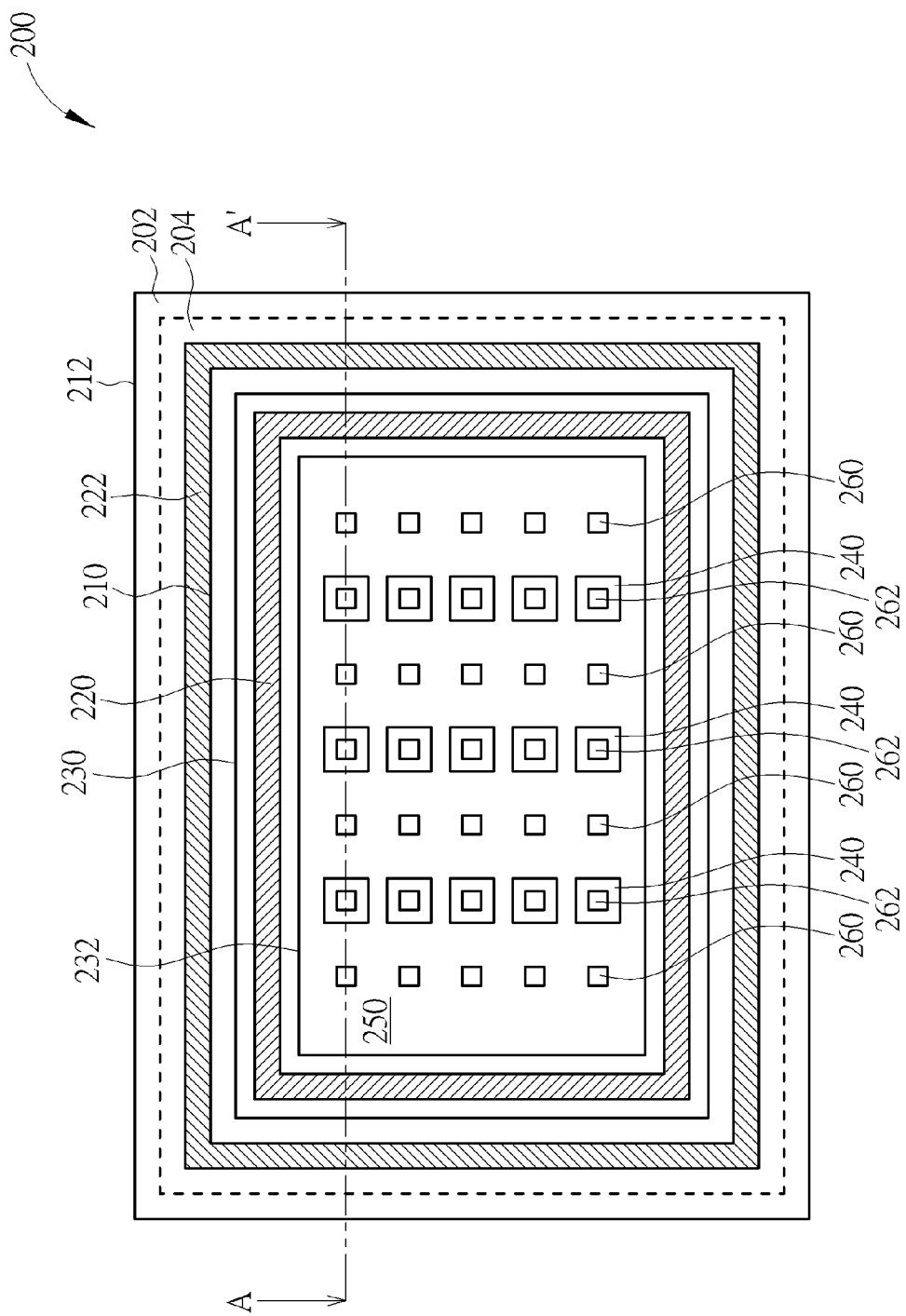
FIG. 3 is a layout structure of a semiconductor device integrated with Schottky diode provided by a first preferred embodiment of the present invention.
Figure 4:
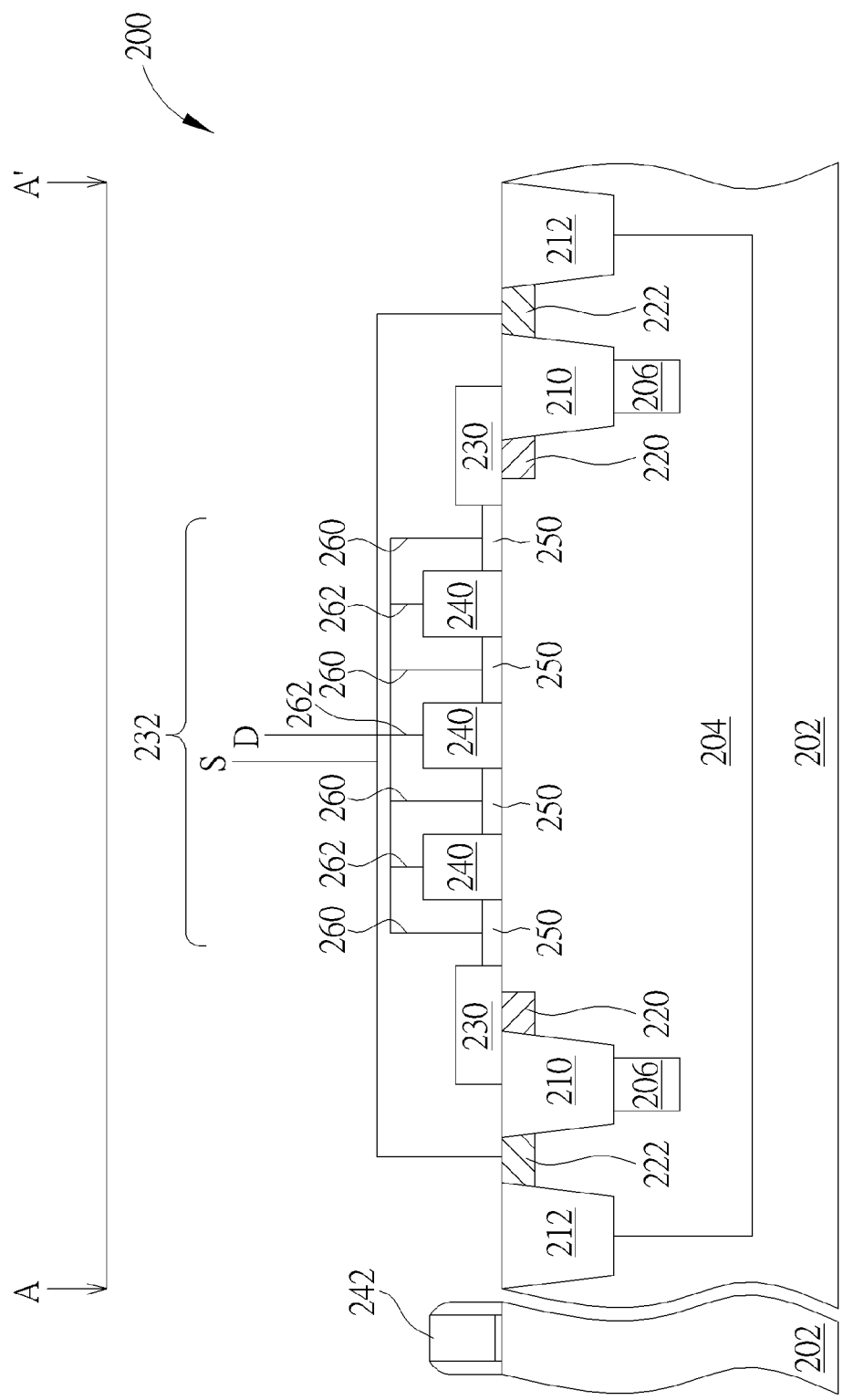
FIG. 4 is a schematic drawing illustrating the semiconductor device integrated with Schottky diode provided by the first preferred embodiment, and a cross-sectional view taken along a line A-A' of FIG. 3.

Please refer to FIGS. 3 and 4, FIG. 3 is a layout structure of a semiconductor device integrated with Schottky diode provided by a first preferred embodiment of the present invention, and FIG. 4 is a schematic drawing illustrating the semiconductor device integrated with Schottky diode provided by the first preferred embodiment. Particularly, FIG. 4 is a cross-sectional view taken along a line A-A' of FIG. 3. As shown in FIGS. 3 and 4, the preferred embodiment provides a semiconductor device integrated with Schottky diode 200. The semiconductor device integrated with Schottky diode 200 includes a substrate 202, and the substrate 202 includes a first conductivity type. In the preferred embodiment, the first conductivity type is p type. In one embodiment of the present invention, the substrate 202 includes a silicon substrate. However in other embodiments of the present invention, the substrate 202 can include any suitable material. For example but not limited to, the substrate 202 can include elementary semiconductor such as germanium (Ge). In other embodiments of the present invention, the substrate 202 can include compound semiconductor such as indium antimonide (InSb), indium arsenide (InAs), indium phosphide (InP), gallium nitride (GaN), gallium arsenide (GaAs), gallium antimonide (GaSb), lead telluride (PbTe), or combination thereof. In still other embodiments of the present invention, an epitaxial layer can be formed on the substrate 202. As shown in FIGS. 3 and 4, a ring-shaped first isolation structure 210 and a ring-shaped second isolation structure 212 are formed in the substrate 202. In the preferred embodiment, the first isolation structure 210 and the second isolation structure 212 can include shallow trench isolations (herein after abbreviated as STIs), but not limited to this.

Pleases refer to FIGS. 3 and 4 again. A first well region 204 is formed in the substrate 202. The first well region 204 includes a second conductivity type, and the first conductivity type and the second conductivity type are complementary to each other. In the preferred embodiment, the second conductivity type is therefore an n type. As shown in FIGS. 3 and 4, the first isolation structure 210 is formed in the first well region 204 while the second isolation structure 212 is formed in the substrate 202, particularly in both of the substrate 202 and the first well region 204. The second isolation structure 212 surrounds the first isolation structure 210 and the first well region 204, and provides electrical isolation between the semiconductor device 200 and other devices. A ring-shaped second well region 206 (not shown in FIG. 3) is formed in the first well region 204 under the first isolation structure 210, and the second well region 206 includes the first conductivity type. A ring-shaped first doped region 220 is formed on an internal side of the first isolation structure 210, and as shown in FIGS. 3 and 4, the first doped region 220 is formed in the first well region 204. The first doped region 220 includes the first conductivity type, and thus the first doped region 220 is a p-typed region. A ring-shaped second doped region 222 is formed in between the first isolation structure 210 and the second isolation structure 212. The second doped region 222 includes the second conductivity type, therefore the second doped region 222 is an n-typed region. It should be noted that the second doped region 222 serves as a source S of the semiconductor device integrated with Schottky diode 200.

Please still refer to FIGS. 3 and 4. According to the preferred embodiment, a ring-shaped SAB layer 230 is formed on the substrate 202. It is noteworthy that the first doped region 220 is disposed under the SAB layer 230, and entirely covered by the SAB layer 230. The ring-shaped SAB layer 230 is formed to define a predetermined region 232 where a Schottky diode is to be formed within. More important, a plurality of assist structures 240 is formed on the substrate 202, and more particularly, formed on the first well region 204 according to the preferred embodiment. As shown in FIG. 4, the assist structures 240 physically contact the first well region 204. It should be noted that the assist structures 240 can include polysilicon. It is well-known that polysilicon which serves as dummy gate is to be replaced with metal materials such as barrier metal layer(s), work function metal layer(s), and filling metal layer(s) in the RMG process, therefore polysilicon formed on the first well region 204 can be simultaneously replaced with the metal materials in the RMG process. Accordingly, the assist structures 240 can include a conductive layer, and the conductive layer can include polysilicon or metal materials as mentioned above. Furthermore, the conductive layer of the assist structures 240 can be a single-layered structure or a multi-layered structure depending on different product requirements. More important, the conductive layers of the assist structures 240 physically contact the first well region 204. As shown in FIG. 3, the assist structures 240 are arranged in an array pattern in the preferred embodiment, but not limited to this. In other preferred embodiments of the present invention, the assist structures 240 can be arranged in a grid pattern, a frame pattern or a stripe pattern as shown in FIGS. 7-10, and those details will be mentioned in the following description.

It is noteworthy that according to the preferred embodiment, elements of the semiconductor device integrated with Schottky diode 200 are formed on the substrate 202 simultaneously with those elements required by other semiconductor devices. For example but not limited to, the first isolation structure 210 and the second isolation structure 212 are formed in the substrate 202 simultaneously with forming other isolation structures by any suitable STI fabrication processes. The assist structures 240 are formed on the substrate 202 simultaneously forming with polysilicon or metal materials which serve as gate conductive layer 242. And the SAB layer 230 is formed on the substrate 202 simultaneously with forming other SAB layer(s), which is required on some regions. Since steps and step orders for forming the aforementioned elements are well-known to those skilled in the art, those details are omitted in the interest of brevity. More important, silicide fabrication process is performed after forming required well/doped regions and aforementioned elements in/on the substrate 202. It is well-known to those skilled in the art that metal silicides are often formed to reduce contact resistances between hetero materials such as semiconductor-metal materials. In a preferred embodiment of the present invention, silicide process is performed to form a metal silicide on the exposed surface of the first well region 204, and the metal silicide formed in the first well region 204 serves as a Schottky barrier structure 250. Consequently, the Schottky barrier structure 250 and the underneath first well region 204 construct a Schottky diode. It is noteworthy that reaction between the metal material and silicon is obstructed by the SAB layer 230 and the assist structures 240, therefore no metal silicides are formed in the first well region 204 at where the SAB layer 230 and the assist structures 240 are disposed. In other words, no Schottky barrier structure 250 is formed at where occupied by the SAB layer 230 and the assist structures 240. As shown in FIG. 3, the Schottky barrier structure 250 is therefore formed in between the assist structures 240.

Please still refer to FIGS. 3 and 4, the semiconductor device integrated with Schottky diode 200 provided by the preferred embodiment further includes a plurality of first contact plugs 260 and a plurality of second contact plugs 262. The first contact plugs 260 and the second contact plugs 262 are all formed in the first well region 204. The first contact plugs 260 physically contact the first well region 204. Furthermore, the first contact plugs 260 are electrically connected to the first well region 204 and a drain D. It is noteworthy that in the preferred embodiment, the second contact plugs 262 are formed on the assist structures 240, respectively. More important, since the assist structures 240 physically contact the first well region 204, the second contact plugs 262 formed on the assist structures 240 are therefore electrically connected to the first well region 204 through the assist structures 240. Accordingly, the assist structures 240 are electrically to the first contact plugs 260 by the first well region 204 while the second contact plugs 262 are electrically connected to the first contact plugs 260 by the assist structures 240 and the first well region 204.

According to the semiconductor device integrated with Schottky diode 200 provided by the preferred embodiment, the assist structures 240 electrically connected to the contact plugs 260/262 are formed in the first well region 204. Consequently, during the planarization processes performed after ILD layer deposition and metal formation required in the RMG process, device density in the first well region 204 is increased due to the placements of the assist structures 240, and thus dishing effect is avoided.

Figure 5:
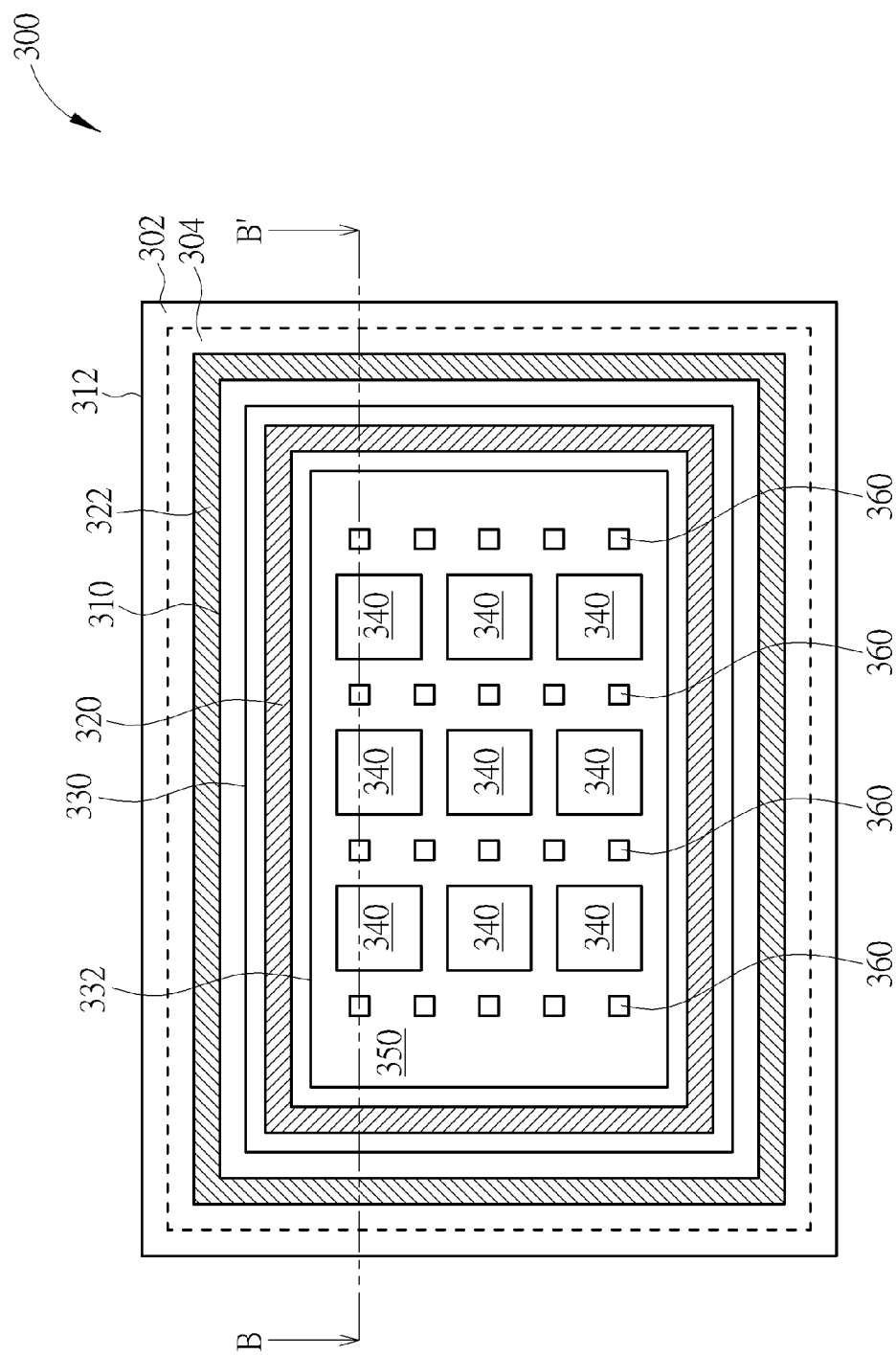
FIG. 5 is a layout structure of a semiconductor device integrated with Schottky diode provided by a second preferred embodiment of the present invention.
Figure 6:
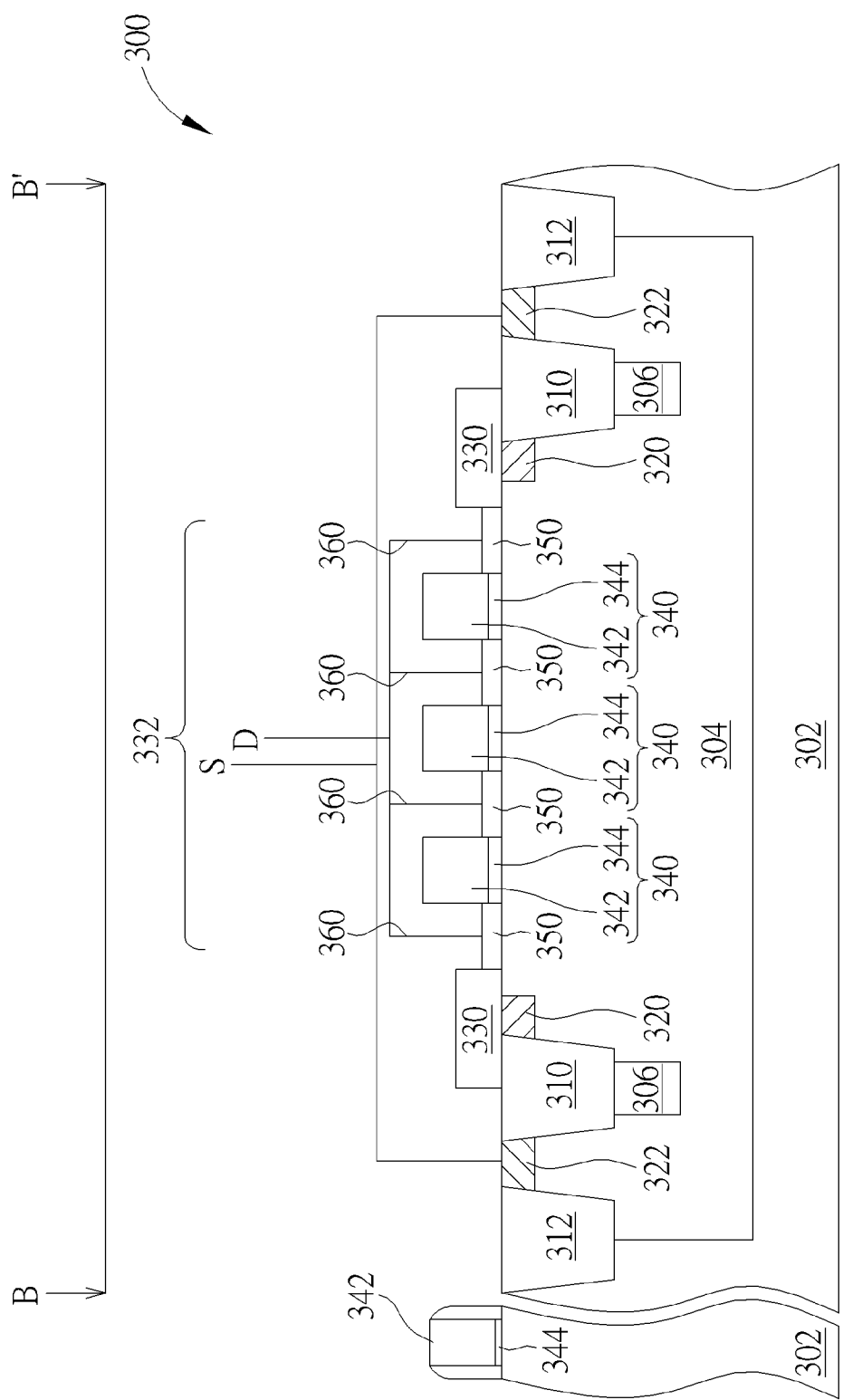
FIG. 6 is a schematic drawing illustrating the semiconductor device integrated with Schottky diode provided by the second preferred embodiment, and a cross-sectional view taken along a line B-B' of FIG. 5.

Please refer to FIGS. 5 and 6, FIG. 5 is a layout structure of a semiconductor device integrated with Schottky diode provided by a second preferred embodiment of the present invention, and FIG. 6 is a schematic drawing illustrating the semiconductor device integrated with Schottky diode provided by the second preferred embodiment. Particularly, FIG. 6 is a cross-sectional view taken along a line B-B' of FIG. 5. It should be noted that elements the same in both of the first and second preferred embodiments can include the same conductivity types and materials choices, and thus those details are omitted hereinafter for brevity. As shown in FIGS. 5 and 6, the preferred embodiment provides a semiconductor device integrated with Schottky diode 300. The semiconductor device integrated with Schottky diode 300 includes a substrate 302, and a ring-shaped first isolation structure 310 and a ring-shaped second isolation structure 312 are formed in the substrate 302 as shown in FIGS. 5 and 6. In some embodiment of the present invention, the first isolation structure 310 and the second isolation structure 312 can include STI, but not limited to this.

Please refer to FIGS. 5 and 6 again, a first well region 304 is formed in the substrate 302, and the first isolation structure 310 is formed in the first well region 304. The second isolation structure 312 is formed in both of the substrate 302 and the first well region 304. Particularly speaking, the second isolation structure 312 surrounds the first isolation structure 310 and the first well region 304 for electrically isolating the semiconductor device 300 from other devices. Furthermore, a ring-shaped second well region 306 (not shown in FIG. 5) is formed in the first well region 304 under the first isolation structure 310. A first doped region 320 is formed on an internal side of the ring-shaped first isolation structure 310. And as shown in FIGS. 5 and 6, the first doped region 320 is formed in the first well region 304. A ring-shaped second doped region 322 is formed in between the first isolation structure 310 and the second isolation structure 312. It should be noted that the second doped region 322 serves as a source S of the semiconductor device integrated with Schottky diode 300.

Please still refer to FIGS. 5 and 6. In the preferred embodiment, a ring-shaped SAB layer 330 is formed on the substrate 302. It is noteworthy that the first doped region 320 is formed under the SAB layer 330 and entirely covered by the SAB layer 330. The ring-shaped SAB layer 330 is formed to define a predetermined region 332 where a Schottky diode is to be formed within. More important, a plurality of assist structures 340 is formed on the substrate 302, and more particularly, formed on the first well region 304 according to the preferred embodiment. As shown in FIG. 6, the assist structures 340 physically contact the first well region 304. It should be noted that the assist structures 340 can include a dielectric layer 344 and a conductive layer 342 stacked on the dielectric layer 344. As shown in FIG. 6, the dielectric layer 344 of the assist structures 340 physically contacts the first well region 304, and thus the conductive layer 342 is electrically isolated from the first well region 304 by the dielectric layer 344. In other words, though the assist structures 340 physically contact the first well region 304, the assist structures 340 are electrically isolated from the first well region 304 due to the dielectric layer 344. The assist structures 340 can be formed on the substrate 302 simultaneously with other elements. For example but not limited to, the dielectric layer 344 of the assist structures 340 can be formed on the substrate 302 simultaneously with forming the gate dielectric layer 344 of MOS transistors, and the conductive layer 342 can be formed on the substrate 302 simultaneously with forming the gate conductive layer 344 of the MOS transistors. The conductive layer 342 of the assist structures 340 can include polysilicon. As mentioned above, polysilicon which serves as dummy gate is to be replaced with metal materials such as barrier metal layer(s), work function metal layer(s), and filling metal layer(s) in the RMG process, therefore polysilicon formed on the first well region 304 can be simultaneously replaced with the metal materials in the RMG process. Accordingly, the dielectric layer 344 of the assist structures 340 can include a conventional gate dielectric layer or a high-k gate dielectric layer, and the conductive layer 342 of the assist structures 340 can include polysilicon or metal layers. Additionally, the conductive layer 342 of the assist structures 340 can be a single-layered structure or a multi-layered structure depending on different product requirements. The assist structures 340 are arranged in an array pattern in the preferred embodiment, but not limited to this. In other preferred embodiments of the present invention, the assist structures 340 can be arranged in a grid pattern, a frame pattern or a stripe pattern as shown in FIGS. 7-10. And those details will be mentioned in the following description.

As mentioned above, elements of the semiconductor device integrated with Schottky diode 300 can be formed simultaneously with those elements required by other semiconductor devices. For example but not limited to, the first isolation structure 310 and the second isolation structure 312 are formed in the substrate 302 simultaneously with forming other isolation structures by any suitable STI fabrication processes. The conductive layer 342 and the dielectric layer 344 of the assist structures 340 are formed on the substrate 302 simultaneously with forming the conductive layer 342 and the dielectric layer 344 of the transistor devices. And the SAB layer 330 is formed on the substrate 302 simultaneously with forming other SAB layer(s), which is required on some regions. Since steps and step orders for forming the aforementioned elements are well-known to those skilled in the art, those details are omitted in the interest of brevity. More important, silicide fabrication process is performed after forming required well/doped regions and aforementioned elements in/on the substrate 302. In a preferred embodiment of the present invention, silicide process is performed to form a metal silicide on the exposed surface of the first well region 304, and the metal silicide formed in the first well region 304 serves as a Schottky barrier structure 350. Consequently, the Schottky barrier structure 350 and the underneath first well region 304 construct a Schottky diode. As mentioned above, reaction between the metal material and silicon is obstructed by the SAB layer 330 and the assist structures 340, therefore no metal silicides are formed in the first well region 304 at where the SAB layer 330 and the assist structures 340 are disposed. As shown in FIGS. 5 and 6, the Schottky barrier structure 350 is therefore formed in between the assist structures 340.

Please still refer to FIGS. 5 and 6. The semiconductor device integrated with Schottky diode 300 provided by the preferred embodiment further includes a plurality of first contact plugs 360. The first contact plugs 360 are all formed in the first well region 304. The first contact plugs 360 physically contact the first well region 304. Furthermore, the first contact plugs 360 are electrically connected to the first well region 304 and a drain D. It is noteworthy that in the preferred embodiment, since the assist structures 340 are electrically isolated from the first well region 304 by the dielectric layer 344, the assist structures 340 is therefore electrically isolated from the first contact plugs 360 formed on the first well region 304. It is concluded that the assist structures 340 provided by the preferred embodiment are structures electrically isolated from any other elements, and thus the assist structures 340 are taken as electrically floating.

According to the semiconductor device integrated with Schottky diode 300 provided by the preferred embodiment, the electrically floating assist structures 340 are formed in the first well region 304. Consequently, during the planarization processes performed after ILD layer deposition and metal formation required in the RMG process, device density in the first well region 304 is increased due to the placements of the assist structures 340 and thus dishing effect is avoided.

Figure 7:
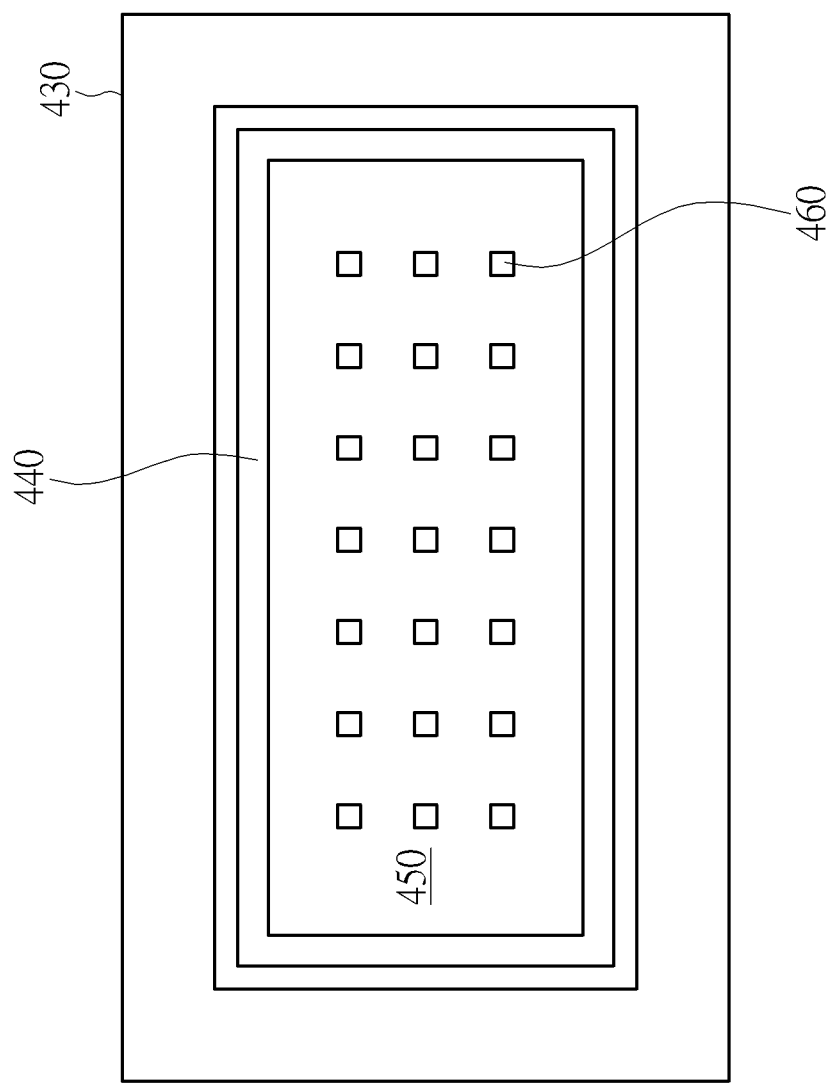
FIGS. 7-10 are schematic drawing illustrating semiconductor devices integrated with Schottky diode provided by other embodiments of the present invention.
Figure 8:
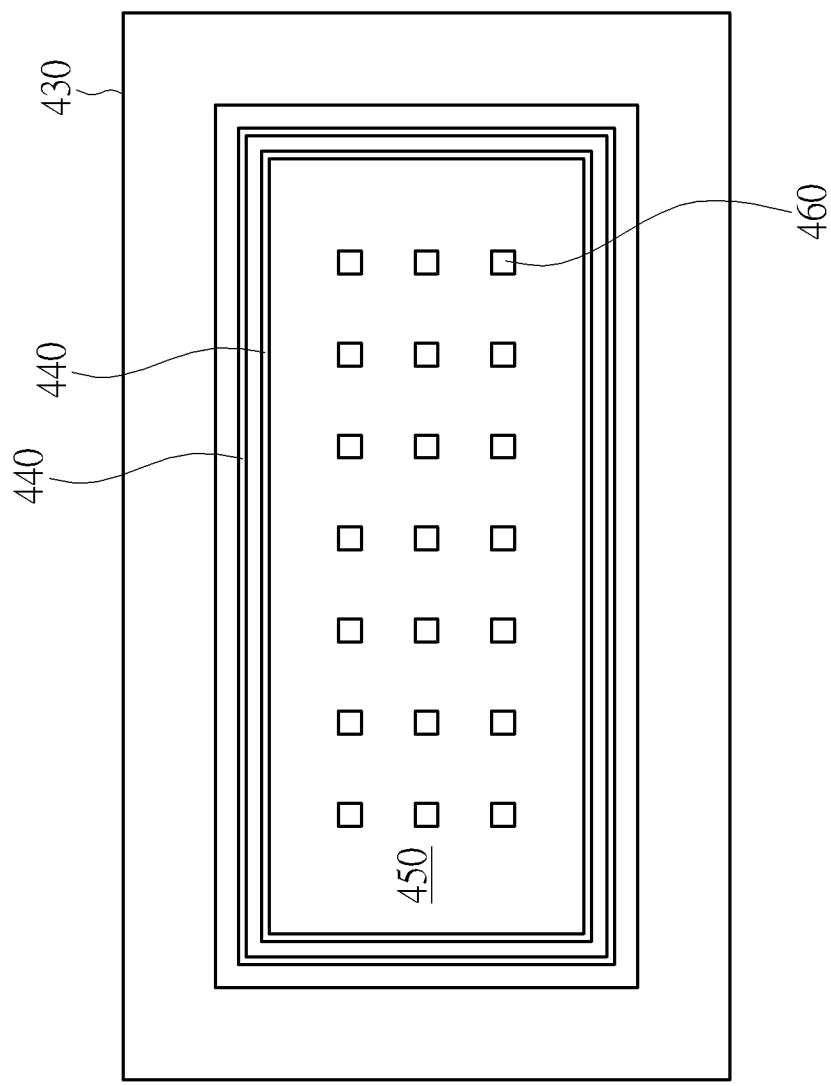
Figure 9:
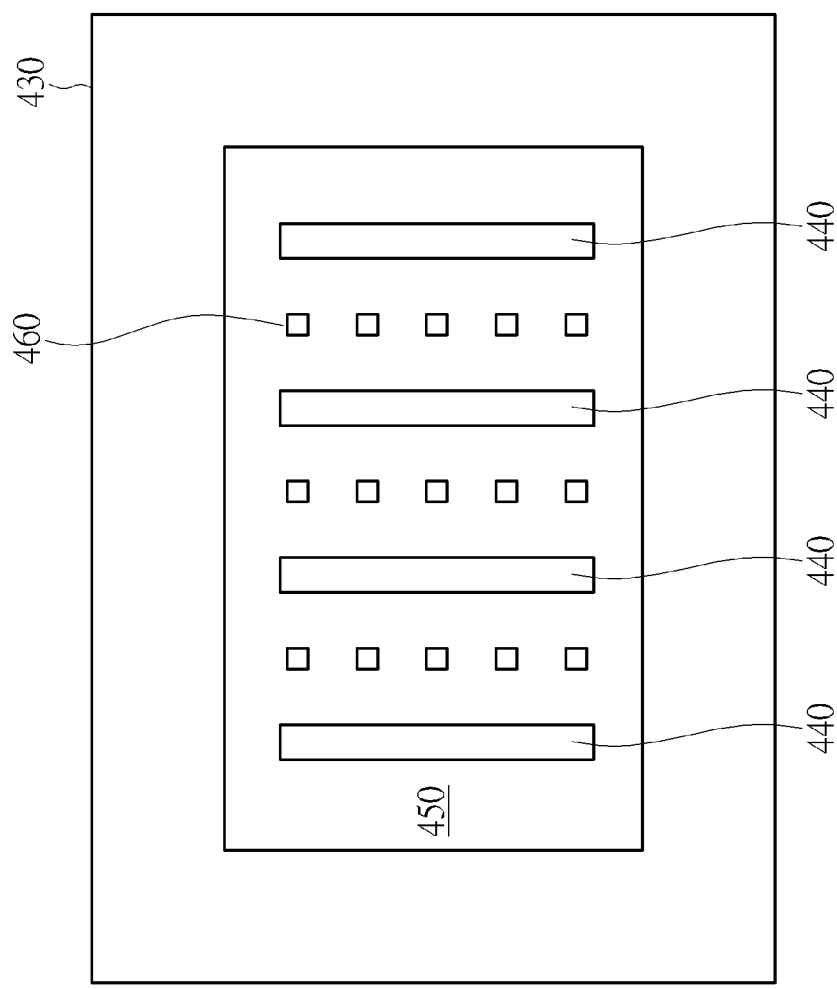
Figure 10:
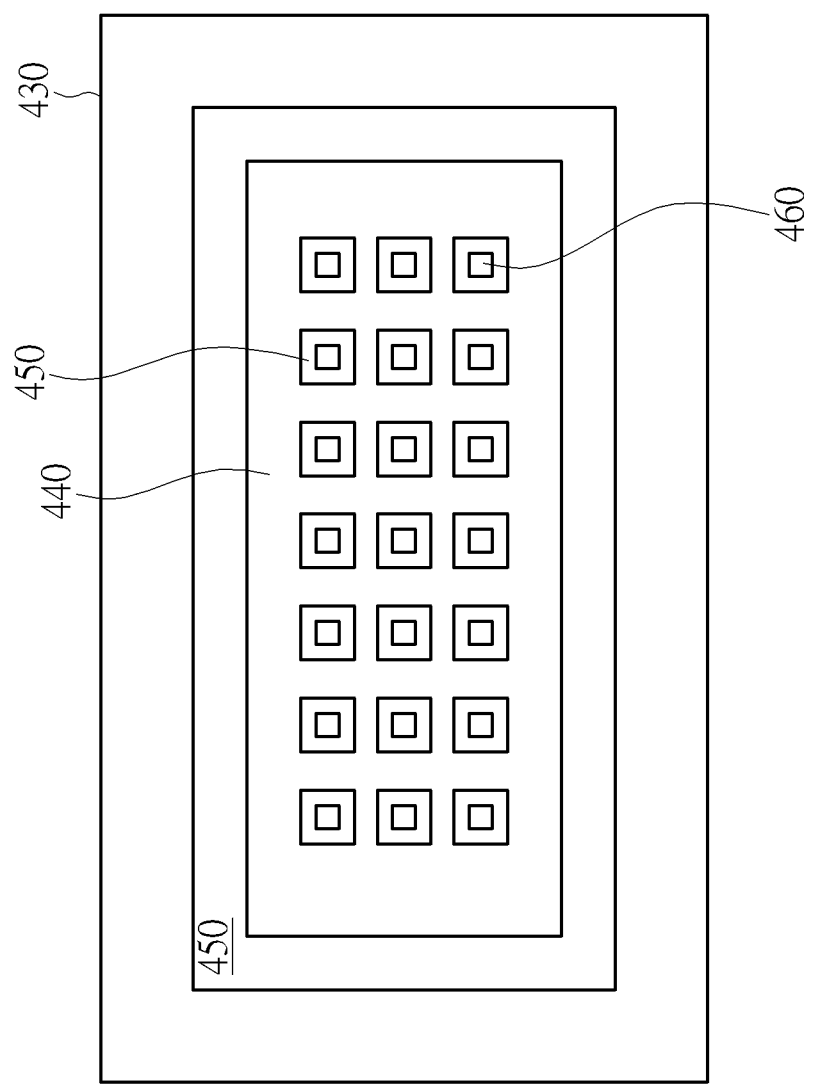

Please refer to FIGS. 7-10, which are schematic drawing illustrating semiconductor devices integrated with Schottky diode provided by other embodiments of the present invention. It should be noted that for clarifying spatial relationship between the assist structures, the SAB layer, the Schottky barrier structure, and the first contact plugs, only the aforementioned four elements are depicted while other elements are omitted from FIGS. 7-10. However those skilled in the art would easily realize the spatial relationships according to the aforementioned first and second preferred embodiments. Also, it is noteworthy that the embodiments shown in FIGS. 7-10 can be adopted in the first and second preferred embodiments and/or any other embodiments of the present invention. In one embodiment of the present invention, the assist structures 440 can be arranged in a dotted-frame pattern or a continuous frame pattern as shown in FIG. 7. And thus as shown in FIG. 7, the assist structures 440 are disposed in between the first contact plugs 460 and the SAB layer 430. Furthermore, the amount of the continuous frame can be adjusted according to different product requirements. For example but not limited to, the assist structures 440 can be arranged in a concentric frames pattern as shown in FIG. 8. Or, the assist structures 440 can include a large frame encircling a plurality of small frames. In another embodiment of the present invention, the assist structures 440 can be arranged in a stripe pattern as shown in FIG. 9. And the assist structures 440 are disposed in between the first contact plugs 460 and in between the first contact plugs 460 and the SAB layer 430. In still another embodiment of the present invention, the assist structures 440 can be arranged in a grid pattern and the first contact plugs 460 are disposed in the meshes. In other words, the assist structures 440 are disposed in between the first contact plugs 460 and in between the first contact plugs 460 and the SAB layer 430. It should be noted that in those preferred embodiments that the assist structures 440 are electrically connected to the first contact plugs 460, second contact plugs (not shown) are respectively formed on the assist structures 440 as mentioned in the first preferred embodiment. Despite the patterns of the assist structures 440, the assist structures 440 are disposed to increase device density at where the Schottky diode is formed and thus dishing effect is avoided.

Briefly speaking, according to the semiconductor devices provided by the present invention, the plurality of assist structures electrically floating or electrically connected to the contact plugs are formed in the first well region, therefore the device density where the Schottky diode is formed is increased and thus dishing effect is efficaciously avoided during the planarization process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a substrate comprising a first conductivity type;
   a first well region formed in the substrate, the first well region comprising a second conductivity type, and the first conductivity type and the second conductivity type being complementary to each other;
   a first isolation structure formed in the first well region;
   a Schottky barrier structure formed on the first well region; and
   a plurality of assist structures formed on the first well region, and the assist structures physically contacting the first well region, wherein the assist structures and the first isolation structure are not overlapped.

2. The semiconductor device according to claim 1, further comprising a plurality of first contact plugs formed in the first well region.

3. The semiconductor device according to claim 2, wherein the assist structures are electrically isolated from the first contact plugs and the first well region.

4. The semiconductor device according to claim 3, wherein the assist structures respectively comprise a dielectric layer, and the dielectric layer contacts the first well region.

5. The semiconductor device according to claim 4, wherein the assist structures respectively comprise a conductive layer formed on the dielectric layer.

6. The semiconductor device according to claim 2, further comprising a plurality of second contact plugs formed on the assist structures, respectively.

7. The semiconductor device according to claim 6, wherein the first contact plugs and the second contact plugs are electrically connected to each other.

8. The semiconductor device according to claim 7, wherein the assist structures respectively comprise a conductive layer, and the conductive layer contacts the first well region.

9. The semiconductor device according to claim 1, wherein the assist structures are arranged in an array pattern, a frame pattern, a grid pattern, or a stripe pattern.

10. The semiconductor device according to claim 1, further comprising:
    a second well region formed in the first well region under the first isolation structure, and the second well region comprising the first conductivity type;
    a second isolation structure formed in the substrate, and the second isolation surrounding the first isolation structure and the first well region;
    a first doped region formed in the first well region, and first doped region comprising the first conductivity type; and
    a second doped region formed in between the first isolation structure and the second isolation structure, and the second doped region comprising the second conductivity type.

11. The semiconductor device according to claim 10, further comprising a self-aligned silicide blocking (SAB) layer formed on the substrate, and the first doped region is formed under the SAB layer.

12. The semiconductor device according to claim 11, wherein the Schottky barrier structure is formed in between the assist structures and/or in between the assist structures and the SAB layer.

13. A semiconductor device comprising:
    a substrate comprising a first conductivity type;
    a first well region formed in the substrate, the first well region comprising a second conductivity type, and the first conductivity type and the second conductivity type being complementary to each other;
    a first isolation structure formed in the first well region;
    a Schottky barrier structure formed on the first well region;
    a plurality of assist structures formed on the first well region, and the assist structures physically contacting the first well region, wherein the assist structures and the first isolation structure are not overlapped; and
    a plurality of first contact plugs formed in the first well region and electrically connected to the assist structures.

14. The semiconductor device according to claim 13, further comprising a plurality of second contact plugs formed on the assist structures, respectively.

15. The semiconductor device according to claim 14, wherein the first contact plugs and the second contact plugs are electrically connected to each other.

16. The semiconductor device according to claim 13, wherein the assist structures respectively comprise a conductive layer, and the conductive layer contacts the first well region.

17. The semiconductor device according to claim 13, wherein the assist structures are arranged in an array pattern, a frame pattern, a grid pattern, or a stripe pattern.

18. The semiconductor device according to claim 13, further comprising:
    a second well region formed in the first well region under the first isolation structure, and the second well region comprising the first conductivity type;
    a second isolation structure formed in the substrate, and the second isolation surrounding the first isolation structure and the first well region;
    a first doped region formed in the first well region, and first doped region comprising the first conductivity type; and
    a second doped region formed in between the first isolation structure and the second isolation structure, and the second doped region comprising the second conductivity type.

19. The semiconductor device according to claim 18, further comprising a self-aligned silicide blocking (SAB) layer formed on the substrate, and the first doped region is formed under the SAB layer.

20. The semiconductor device according to claim 19, wherein the Schottky barrier structure is formed in between the assist structures and or in between the assist structures and the SAB layer.

* * * * *